(12) United States Patent
Hooijer et al.

(10) Patent No.: US 11,357,122 B2
(45) Date of Patent: Jun. 7, 2022

(54) DRIVER HOUSING

(71) Applicant: SIGNIFY HOLDING B.V., Eindhoven (NL)

(72) Inventors: Christofher Daniel Charles Hooijer, Eindhoven (NL); Mark Johannes Antonius Verhoeven, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 107 days.

(21) Appl. No.: 16/958,724

(22) PCT Filed: Jan. 23, 2019

(86) PCT No.: PCT/EP2019/051621
§ 371 (c)(1),
(2) Date: Jun. 28, 2020

(87) PCT Pub. No.: WO2019/149596
PCT Pub. Date: Aug. 8, 2019

(65) Prior Publication Data
US 2021/0014990 A1    Jan. 14, 2021

(30) Foreign Application Priority Data

Jan. 30, 2018   (EP) .................................... 18154202

(51) Int. Cl.
*H05K 5/02*    (2006.01)
*F21V 15/01*   (2006.01)

(52) U.S. Cl.
CPC .......... *H05K 5/0247* (2013.01); *F21V 15/01* (2013.01)

(58) Field of Classification Search
None
See application file for complete search history.

(56) References Cited

U.S. PATENT DOCUMENTS 6,601,976 B1 *   8/2003  Rhee ..................... F21V 15/01
                                                    362/374
6,790,050 B1    9/2004  Roth-Stielow et al.
(Continued)

FOREIGN PATENT DOCUMENTS

CN     101897092 A    11/2010
CN     103444026 A    12/2013
(Continued)

*Primary Examiner* — Xanthia C Cunningham
(74) *Attorney, Agent, or Firm* — Daniel J. Piotrowski (57) ABSTRACT

The invention provides a luminaire comprising a luminaire housing accommodating a driver housing assembly, the driver housing assembly comprising a driver housing and a cable; the driver housing (10) comprising: a terminal block (11) for connecting a cable (30) to a driver; a compartment (12) for receiving the cable (30); a first housing wall (14) adjacent to a second housing wall (24), wherein the first housing wall (14) comprises a first entrance (15) arranged for receiving the cable (30) and the second housing wall (24) comprises a second entrance (25) arranged for receiving the cable (30), and wherein said first housing wall (14) and said second housing wall (24) enclose a part of the compartment (12); a lid (13) for closing the compartment (12) and for in closed position confining the cable (30) in the first entrance (15) or the second entrance (25); wherein the cable is connected to the terminal block, and wherein the cable is received by the driver housing via either the first entrance or the second entrance.

15 Claims, 6 Drawing Sheets

(56) References Cited

U.S. PATENT DOCUMENTS

| | | | |
|---|---|---|---|
| 9,335,037 B2* | 5/2016 | Peeters | F21V 23/06 |
| 2013/0201697 A1* | 8/2013 | Osada | F21K 9/20 |
| | | | 362/373 |
| 2013/0272012 A1* | 10/2013 | Thibodeau | B60Q 3/53 |
| | | | 362/546 |
| 2014/0182877 A1 | 7/2014 | Jolly | |
| 2016/0040839 A1 | 2/2016 | Driscoll | |
| 2017/0114991 A1 | 4/2017 | Yang et al. | |
| 2017/0254513 A1* | 9/2017 | Van Delden | F21V 23/005 |
| 2017/0261184 A1 | 9/2017 | Oksengendler et al. | |
| 2018/0238501 A1* | 8/2018 | Honda | F21S 9/022 |
| 2020/0041079 A1* | 2/2020 | Mellor | F21S 8/066 |

FOREIGN PATENT DOCUMENTS

| | | |
|---|---|---|
| CN | 203454074 U | 2/2014 |
| CN | 204291660 U | 4/2015 |
| CN | 204647915 U | 9/2015 |
| EP | 1153534 A1 | 11/2001 |
| EP | 3200573 A1 | 8/2017 |
| JP | 2001273812 A | 10/2001 |
| JP | 2003530687 A | 10/2003 |

* cited by examiner

DRIVER HOUSING

CROSS-REFERENCE TO PRIOR APPLICATIONS

This application is the U.S. National Phase application under 35 U.S.C. § 371 of International Application No. PCT/EP2019/051621, filed on Jan. 23, 2019, which claims the benefit of European Patent Application No. 18154202.8, filed on Jan. 30, 2018. These applications are hereby incorporated by reference herein.

FIELD OF THE INVENTION

The invention relates to a driver housing. The invention further relates to driver housing assembly comprising the driver housing and a cable. The invention further relates to a luminaire comprising a luminaire housing accommodating said driver housing assembly. The invention further relates to a method of confining a cable in a driver housing, and to a method of accommodating a driver housing assembly in a luminaire comprising a luminaire housing.

BACKGROUND OF THE INVENTION

A driver is relevant for many electrical devices, such as a lighting device or a luminaire. A clear push exists in industry to miniaturize drivers and/or products comprising a driver, as this allows producing more compact electrical devices and improving consumer experience. Another trend in industry is to ensure the suitability of a single type of driver for many different configurations of an electrical device. To achieve said miniaturizing and said flexibility, the architecture of the driver components and the configuration of the driver housing is key.

A solution is for example known from US2017/0114991, wherein a LED driving structure includes a lower housing, upper housing, a separating board, and an upper cover. Said lower housing has a hollow box structure and comprises a wiring terminal. Said lower housing is further provided with a wiring hole, wherein the wiring hole is optionally provided with a metallic cover. During a wiring operation, the metallic cover is knocked off and a wiring tube is extended through the wiring hole for connecting the wiring tube with said wiring terminal. Although such a wiring hole provides an advantage in wiring the driver in different wiring configurations, such a LED driving structure is still limited in wiring flexibility and ergonomics, because said wiring tube is statically fixed in the hole after said wiring operation and too many actions are required to dismantle the driver housing and rearrange the driver architecture accordingly.

Prior art discloses that a cable may enter a driver housing at a defined location. Such an entry location is often fixed and determined by the driver architecture. This results in a lack of flexibility, which may prevent miniaturization and makes a single driver housing unsuitable for application in different device configurations.

SUMMARY OF THE INVENTION

It is an object of the invention to provide an improved luminaire comprising a luminaire housing accommodating an improved driver housing assembly according to the invention.

It is an object of the invention to provide an improved driver housing, which at least alleviates the problems mentioned above. Thereto, the invention provides a driver housing comprising: a terminal block for connecting a cable to a driver; a compartment for receiving the cable; a first housing wall adjacent to a second housing wall, wherein the first housing wall comprises a first entrance arranged for receiving the cable and the second housing wall comprises a second entrance arranged for receiving the cable, and wherein said first housing wall and said second housing wall enclose a part of the compartment; a lid for closing the compartment and for in closed position confining the cable in the first entrance or the second entrance.

Such a driver housing comprises a compartment for receiving a cable. This compartment may be partly enclosed by the first housing wall and the second housing wall, wherein the first housing wall is adjacent to the second housing wall, and wherein the first housing wall comprises a first entrance arranged for receiving the cable and the second housing wall comprises a second entrance arranged for receiving the cable. Said cable may subsequently be connected to at least one driver in the driver housing via said terminal block. Said driver housing comprises further a lid for closing the compartment. When the lid is in open position, the compartment is configured to receive the cable via either said first entrance or said second entrance, which receiving advantageously enables the cable to be re-routed via either the first entrance or (transverse to it) the second entrance. When the lid is in closed position, the cable may hence be confined in either the first entrance or the second entrance.

Thus, the present invention provides an improved driver housing, which advantageously enables a cable to be re-routed within the driver housing, without the need to disconnect said cable from the driver and/or terminal block.

Hence, the improved driver housing provides flexibility and ergonomics in positioning the cable accordingly without the need of a wiring operation (i.e. disconnecting/connecting the wiring of the driver). Moreover, as the first housing wall is adjacent and transverse to the second housing wall, an option is available to re-route the cable to exit the driver housing in directions transverse to each other. This enables a single driver housing to be suitable for application in different device configurations, and facilitates miniaturization of products comprising a driver, as the position of the cable is not a fixed constraint anymore.

For example: A luminaire may accommodate a driver housing. Due to miniaturization, the driver housing may be fitted into the luminaire without any tolerance. However, tolerance is always necessary at a location where a cable enters/exits the driver housing. If a driver housing comprises a fixed cable entry, such a driver housing may be positioned into the luminaire with less possible configurations compared to a driver housing according to the present invention; because the improved driver housing according to the present invention provides flexibility to re-route the cable and choose the location where the desired tolerance is present and the cable can enter/exit the driver housing, without the need to disconnect the cable from the driver.

The driver housing may be a lighting driver housing.

In an embodiment, the first housing wall is transverse to the second housing wall. In a further embodiment, the second housing wall may be skewed in respect to the second housing wall at an angle, wherein said angle may e.g. be the inner angle of two housing walls and at a range between 60 degrees and 160 degrees, for example 60 degrees, 90 degrees, 108 degrees, 150 degrees, or 135 degrees. For example, when the driver housing comprises a perfect triangular shape, a first housing wall and a second housing wall (assuming the edges of the perfect triangle) may be skewed in respect to each other at an inner angle of 60 degrees. Or, for example, when the driver housing comprises an octagonal shape, said inner angle may be 135 degrees; and mutatis mutandis for other shapes such as pentagon, square, etc.

Said cable may be a mains cable. Said cable may moreover be a control cable, for example DALI wiring. Said cable may also be an output cable feeding a load, such as e.g. wiring for driving a semiconductor lighting device, such as e.g. a LED. Furthermore, the cable may be connected to at least one driver via a terminal block in the driver housing. Such a connection may be fixed and/or partly fixed, as known from known terminal blocks.

Said driver housing and said corresponding first housing wall, second housing wall, and/or said lid, may be at least one of a metal, a plastic or a ceramic. Said driver housing may further be produced by additive manufacturing, 3D-printing and/or molding. The lid may for example be 2-component-injection-molded simultaneously with the driver housing.

Said driver housing may accommodate at least one driver. Said driver housing may further accommodate electronics related to sensors related to the load driven by the driver. Said driver housing may be part of an electronic device housing. Said driver housing may comprise a rectangular, a square, a tubular, and/or an elongated hollow plate shape.

In an embodiment, in closed position, the lid may be adjacent to both the first housing wall and the second housing wall. For example, when the first housing wall and the second housing wall are the side walls of a rectangular box, the lid may be part of a top wall of the rectangular box. In another example, when the first housing wall and the second housing wall are the side walls of a rectangular box, wherein both side walls are adjacent to each other along the corresponding edge of said rectangular box, the lid may be part of the edge of said rectangular box and may abut/be adjacent to both the first housing wall and the second housing wall; hence the lid may be slid into the corresponding part of said edge to close the compartment.

Moreover, said lid may prevent loose wiring to be exposed exterior to the driver housing, hence preventing possible dangerous conditions. In an embodiment, said lid may comprise a locking mechanism for locking the lid to the driver housing. Said locking mechanism may for example be a snap fit; or alternatively a magnetic lock, an adhesive lock such as a sticker, or a tight fit lock. Furthermore, the lid may pivot in the driver housing, or alternatively be a separate detachable part.

As mentioned, the first entrance is arranged for receiving the cable and the second entrance is arranged for receiving the cable. In an embodiment, the first entrance and the second entrance may be arranged for detachably fixating the cable to the driver housing. The effect of such an embodiment is that the cable may be detachably fixated to either the first entrance or the second entrance, providing a constraint at that location, and subsequently be detached—when desired—from said first entrance or said second entrance so as to enable the re-routing of said cable to another respective entrance. Said detachably fixating may be performed by multiple different mechanical options. Hence, in an embodiment, the first entrance and the second entrance may be arranged for detachably fixating the cable to the driver housing by tight-fitting the cable and/or snap-fitting the cable.

Said first and second entrance may comprise a similar shape. Said first entrance and said second entrance may comprise a slit, an aperture, or a gap; which may have different possible shapes, such as e.g. round, partly round, elliptic, partly elliptic, square, triangular, partly triangular, drop-shape, etc. Said shape may be part of the tight-fitting and/or snap-fitting architecture of the means for detachably fixating the cable. For example, the entrance being a drop shape with open top may allow a round cable to be pressed through the narrow top and detachably fixated in the bottom drop shape (as one may press the cable out again).

The configuration of the compartment itself may also enable a cable to be received and guided accordingly to the terminal block. Hence, in an embodiment, the compartment may comprise a first groove arranged for receiving and/or detachably fixating the cable, and wherein the compartment may comprise a second groove arranged for receiving and/or detachably fixating the cable. Such an embodiment may enable the cable to be positioned accordingly in the compartment and may prevent any play of the cable (e.g. preventing possible detached wiring). Moreover, such an embodiment may enable pull-prevention of the cable.

In an embodiment, in closed position the lid may fixate the cable in the first entrance and in the second entrance. Similarly, such an embodiment may enable the cable to be positioned accordingly in the compartment and may prevent any play of the cable (e.g. preventing possible detached wiring). Moreover, such an embodiment may enable pull-prevention of the cable. The lid may for example comprise an edge pressing the cable in the respective entrance. Moreover, the lid may for example provide a clamping feature and, for example, thereto comprise an edge pressing with a clamping fit the cable in the respective entrance.

Said terminal block may be used (especially in the European Union due to regulations) to connect the cable to the driver. It may be advantageous to position the terminal block in the compartment. Hence, in an embodiment, the compartment comprises the terminal block. Such an embodiment also enabled the terminal block to be accessible when said lid is opened; thus providing additional flexibility in accessing the terminal block and/or the driver. The terminal block may also be positioned in a separate compartment adjacent to the compartment according to the invention. In such a case, vulnerable driver components including the terminal block may be protected in another compartment, while the compartment of the present invention enables connecting/disconnecting the driver without the need to open the driver housing (completely) and expose vulnerable driver components, but only by opening the compartment (without tools).

In an embodiment, the driver housing comprises a driver compartment for accommodating the driver. Thus, the driver compartment comprises the driver. Said driver may be a lighting driver. The driver compartment may be separate to the compartment according to the invention. The driver compartment may be adjacent to the compartment according to the invention. The terminal block may, as partly mentioned before, also be located within the driver compartment. Therefore, the lid may only close said compartment and not the driver compartment. Hence, the driver compartment comprising the driver may be sealed and protected against any exposure to the environment. In an embodiment, the first housing wall is perpendicular to the second housing wall with an angular margin of at most 5 degrees. Hence, the cable may be received by the driver housing either horizontally or vertically with respect to one of its edges. This enables a single driver housing to be suitable for application in different device configurations, and facilitates miniaturization of products comprising a driver, as the position of the cable is not a fixed constraint anymore. Alternatively, said margin may be at most 10 degrees.

As miniaturization of drivers and/or electronic devices is relevant, it may be advantageous to limit the total volume of the compartment with respect to the total volume of the driver housing. Hence, in an embodiment, a total volume of the compartment is at most 10% of a total volume of the driver housing. Consequently, with such a limited occupied volume within the driver housing, the present invention provides a driver housing which is suitable for application in different device configurations.

Similarly, it may be advantageous to position the compartment at a location within the driver housing that does not occupy an area for placing a PCB. Hence, in an embodiment, a driver housing according to the invention is provided, wherein the driver housing further comprises a top housing wall opposite and parallel to a bottom housing wall, wherein the top housing wall and the bottom housing wall are both adjacent to both the first housing wall and the second housing wall; wherein the driver housing further comprises a height, the height being defined as the shortest distance ranging from the bottom housing wall to the top housing wall; and wherein the compartment is located in the driver housing above a plane spanned by the first housing wall and the second housing wall and parallel to the bottom housing wall, which plane is located within the upper 25% of said height of the driver housing. Thus, as the compartment is located within the upper 25% of said height of the driver housing, the lower 75% is completely available to locate other components, such as a PCB.

Moreover, in further examples, depending on the application, the demands and/or the dimensions of the driver housing, the compartment may be placed next to the PCB or (sufficiently) above the PCB. Thus in some examples, the compartment may be positioned at a certain side or edge of the driver housing, such that an remaining side can host a PCB or chipset.

Furthermore, in further examples, the driver housing may also comprise a third entrance for re-routing said cable. Hence, in examples, the driver housing comprises a third housing wall adjacent to the first housing wall and to the second housing wall, wherein the third housing wall comprises a third entrance arranged for receiving the cable, and wherein said third housing wall, said first housing wall and said second housing wall enclose a part of the compartment; and wherein the lid is further arranged for in closed position confining the cable in the third entrance, first entrance or the second entrance.

The embodiments applying to features related to the first entrance or the second entrance, the first housing wall or the second housing wall, may apply mutatis mutandis for said third entrance and said third housing wall. For example, said third entrance may also be arranged for detachably fixating the cable to the driver housing; Or: wherein in closed position the lid fixates the cable in the first entrance, in the second entrance, or in the third entrance. Moreover, the compartment may further comprise a first groove arranged for receiving and/or detachably fixating the cable.

Such a third entrance provides additional flexibility to the present invention, because the cable may be re-routed within the driver housing in more directions, without the need to disconnect said cable from the driver and/or terminal block. Thus, a single driver housing according to the invention may be positioned within e.g. a lighting fixture in more configurations without elaborate modification.

It is a further object of the invention to provide an improved driver housing assembly comprising an improved driver housing and a cable. Thereto, the invention further provides a driver housing assembly comprising the driver housing according to the present invention and a cable, wherein the cable is connected to the terminal block, and wherein the cable is received and/or detachably fixated by the driver housing via either the first entrance or the second entrance. The advantages applying to the driver housing according to the invention also apply to the driver housing assembly according to the invention. In a further embodiment, the cable is a mains cable. Such a mains cable may feed a lighting device. As such a mains cable requires much tolerance at the location where it enters the driver, the present invention is particularly advantageous whenever the cable is a mains cable, because such a mains cable may be re-routed within the driver housing, without the need to disconnect said mains cable from the driver and/or terminal block.

Furthermore, as mentioned, in further examples of said driver housing assembly, the driver housing may also comprise a third entrance for re-routing the cable of the driver housing assembly. Thus, a driver housing assembly may be provided, wherein the driver housing assembly may comprise the driver housing according to the present invention and a cable, wherein the cable is connected to the terminal block, and wherein the cable is received and/or detachably fixated by the driver housing via either the first entrance, the second entrance, or the third entrance.

As mentioned, it is an object of the invention to provide an improved luminaire comprising a luminaire housing accommodating said improved driver housing assembly according to the invention. Thereto, the invention further provides a luminaire comprising a luminaire housing accommodating the driver housing assembly according to the invention. The advantages applying to the driver housing and driver housing assembly according to the invention also apply to the luminaire according to the invention. Said luminaire may for example be a track lighting fixture, a spotlight or a TLED fixture.

Moreover, the present invention enables a single driver housing assembly to be fitted in different orientations in a single type of luminaire housing, wherein the fit is as optimal as possible; and/or the present invention enables a single driver housing assembly to be fitted into different type of luminaire housings, as it may be oriented differently without having a tolerance constraint at the location where a cable enters/exits the driver housing.

For example: A driver housing assembly may be fitted into a luminaire housing. Said cable (e.g. a mains cable) may enter the driver housing via the first entrance. Hence, the driver housing assembly requires tolerance at the first entrance, because the cable enters (or: sticks out) the driver housing at this first entrance. Therefore, the driver housing assembly cannot be tightly fitted to the luminaire housing at the side of the first entrance. Therefore, a clear constraint exits in positioning said driver housing assembly inside the luminaire housing. However, as the driver housing assembly according to the present invention enables the cable to be re-routed to a different entrance, i.e. the second entrance transverse to the first entrance, the driver housing assembly does not comprise said constraint and can more easily be fitted to the luminaire housing at the side of the first entrance. Namely, the cable is merely re-routed by opening the lid closing the compartment, re-align the cable, and close the lid for confining the cable. As a result of this, the driver housing assembly can be positioned in more different configurations within the luminaire. Moreover, a single driver housing assembly can be produced and implemented in different luminaires and corresponding luminaire housings.

The examples of a driver housing, or driver housing assembly, comprising a third entrance may mutatis mutandis be accommodated in said luminaire housing of said luminaire. The same advantages apply.

Hence, in an embodiment, the luminaire housing comprises an inner wall for fitting the driver housing assembly, and wherein the driver housing assembly is in connection with said inner wall via either the first housing wall or the second housing wall. Thus, the driver housing assembly may be tightly fitted to an inner wall of the luminaire housing via either the first housing wall or the second housing wall, which provides flexibility in configuration of a luminaire, because the constraint of the cable entering/exiting the driver housing is resolved/freed.

Alternatively, as mentioned before, in examples with a third housing wall and a third entrance, said driver housing assembly may be in connection with said inner wall via either the first housing wall, the second housing wall, or the third housing wall.

In an embodiment, the luminaire is a spot light. Such a spot light may comprise a tubular, e.g. cylindrical housing. In an embodiment, the luminaire housing comprises a cylindrical shape. In an embodiment, the luminaire housing is made of metal. Hence, it may be advantageous to prevent loose wiring exiting the driver housing, which may be prevented by said lid.

It is a further object of the invention to provide an improved method of confining a cable in a driver housing. Thereto, the invention further provides a method of confining a cable in a driver housing according to the invention, wherein the method comprises the steps of: connecting the cable to the terminal block; receiving and/or detachably fixating the cable via either the first entrance or the second entrance (or the third entrance if applicable); confining the cable in respectively the first entrance or the second entrance (or the third entrance if applicable) by closing the lid. The advantages applying to the driver housing and driver housing assembly according to the invention also apply to the luminaire according to the invention.

It is a further object of the invention to provide an improved method of accommodating a driver housing assembly in a luminaire comprising a luminaire housing. Thereto, the invention further provides a method of accommodating a driver housing assembly according to the invention in a luminaire comprising a luminaire housing, the method comprises the steps of: fitting the driver housing assembly inside the luminaire housing of the luminaire, wherein the driver housing assembly is in connection the said inner wall via either the first housing wall or the second housing wall (or the third housing wall if applicable), and wherein the cable is received and/or detachably fixated by the driver housing via either the first entrance or the second entrance (or the third entrance if applicable). The advantages applying to the driver housing and driver housing assembly according to the invention also apply to the luminaire according to the invention.

It is a further object of the invention to provide a driver housing according to the first object of the invention, but wherein the driver housing comprises a further compartment, e.g. a second compartment, identical or similar to the compartment. Said further compartment, e.g. said second compartment, may be mutatis mutandis enclosed by a fourth housing wall and a fifth housing wall. For example, considering the driver housing to be a square box, the compartment and the further compartment according to the invention may be positioned at opposite edges of the square box across the diagonal thereof. Thus, in examples, the invention may provide a driver housing comprising: a terminal block for connecting a cable to a driver; a compartment for receiving the cable; a first housing wall adjacent and transverse to a second housing wall, wherein the first housing wall comprises a first entrance arranged for receiving the cable and the second housing wall comprises a second entrance arranged for receiving the cable, and wherein said first housing wall and said second housing wall enclose a part of the compartment; a lid for closing the compartment and for in closed position confining the cable in the first entrance or the second entrance; a further terminal block for connecting a further cable to the driver; a further compartment for receiving the further cable; a fourth housing wall adjacent to a fifth housing wall, wherein the fourth housing wall comprises a fourth entrance arranged for receiving the further cable and the fifth housing wall comprises a fifth entrance arranged for receiving the further cable, and wherein said fourth housing wall and said fifth housing wall enclose a part of the further compartment; a further lid for closing the further compartment and for in closed position confining the further cable in the fourth entrance or the fifth entrance.

Similarly, said driver housing, or said driver housing assembly, which comprises a further compartment as mentioned above may also be mutatis mutandis accommodated by the luminaire according to the invention. Such a further compartment provides additional flexibility and application to the present invention, because the cable and the further cable may be re-routed within the driver housing in more directions, without the need to disconnect said cable from the driver and/or terminal block. Thus, a single driver housing according to the invention may be positioned within e.g. a lighting fixture in more configurations without elaborate modification, and for a cable and a further cable; e.g. cables entering the driver housing from opposite ends, for example a mains cable and a control cable feeding a light source.

It is further object to the invention to provide a driver for use in the luminaire according to the invention. The driver may be a lighting driver, e.g. a driver for a spot light. It is further object to the invention to provide a driver housing for use in the luminaire according to the invention. It is further object to the invention to provide a kit of parts comprising the driver housing according to the invention and the luminaire according to the invention. The kit of parts may be assembled wherein the driver housing is fitted in the luminaire according to the method (above) according to the invention.

BRIEF DESCRIPTION OF THE DRAWINGS

The invention will now be further elucidated by means of the schematic non-limiting drawings.

DETAILED DESCRIPTION OF THE EMBODIMENTS

As mentioned, the present invention provides an improved driver housing and improved driver housing assembly, which advantageously enable a cable to be re-routed within said driver housing, without the need to disconnect said cable from a driver and/or terminal block comprised within said driver housing.

Figure 1A:
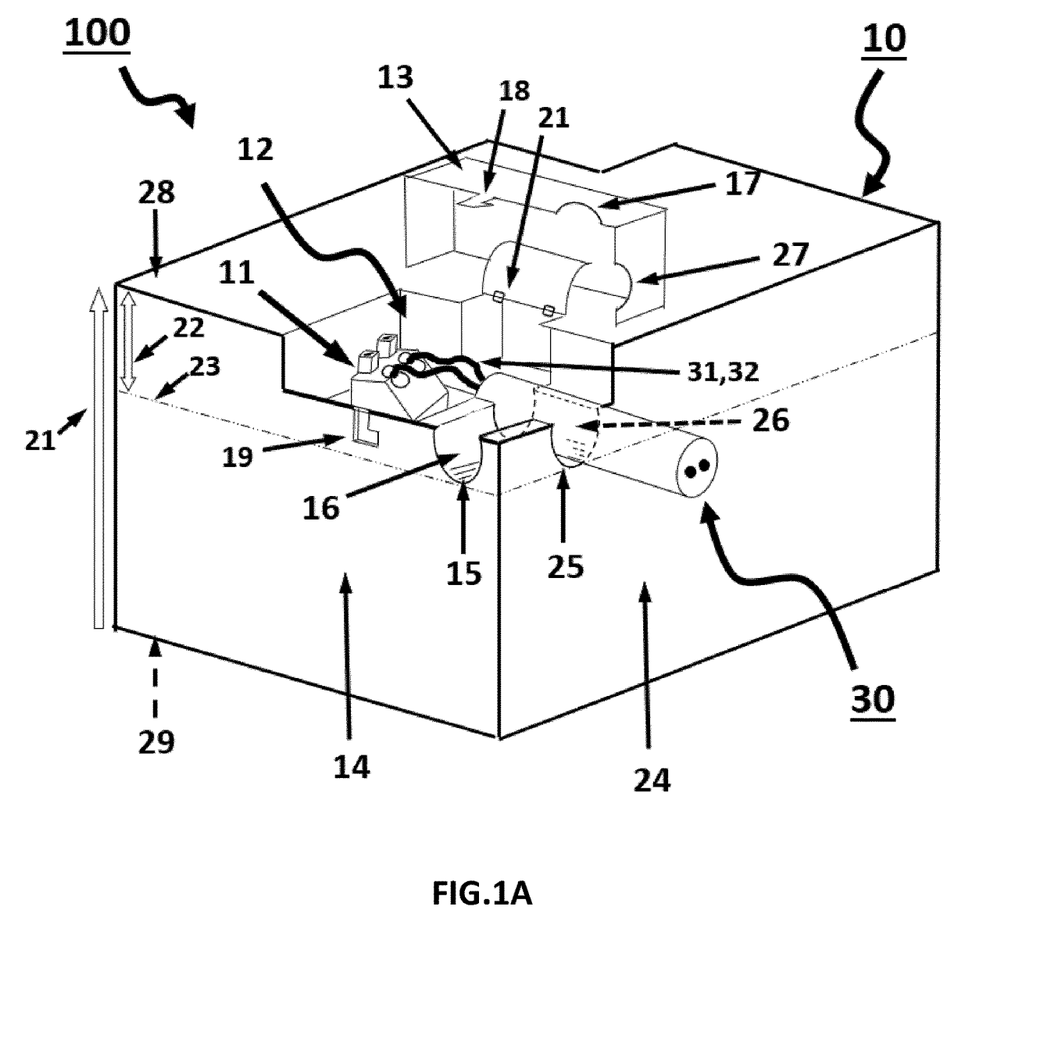
FIG. 1A depicts schematically a first embodiment of a driver housing assembly comprising a driver housing and a mains cable, whereby
Figure 1B:
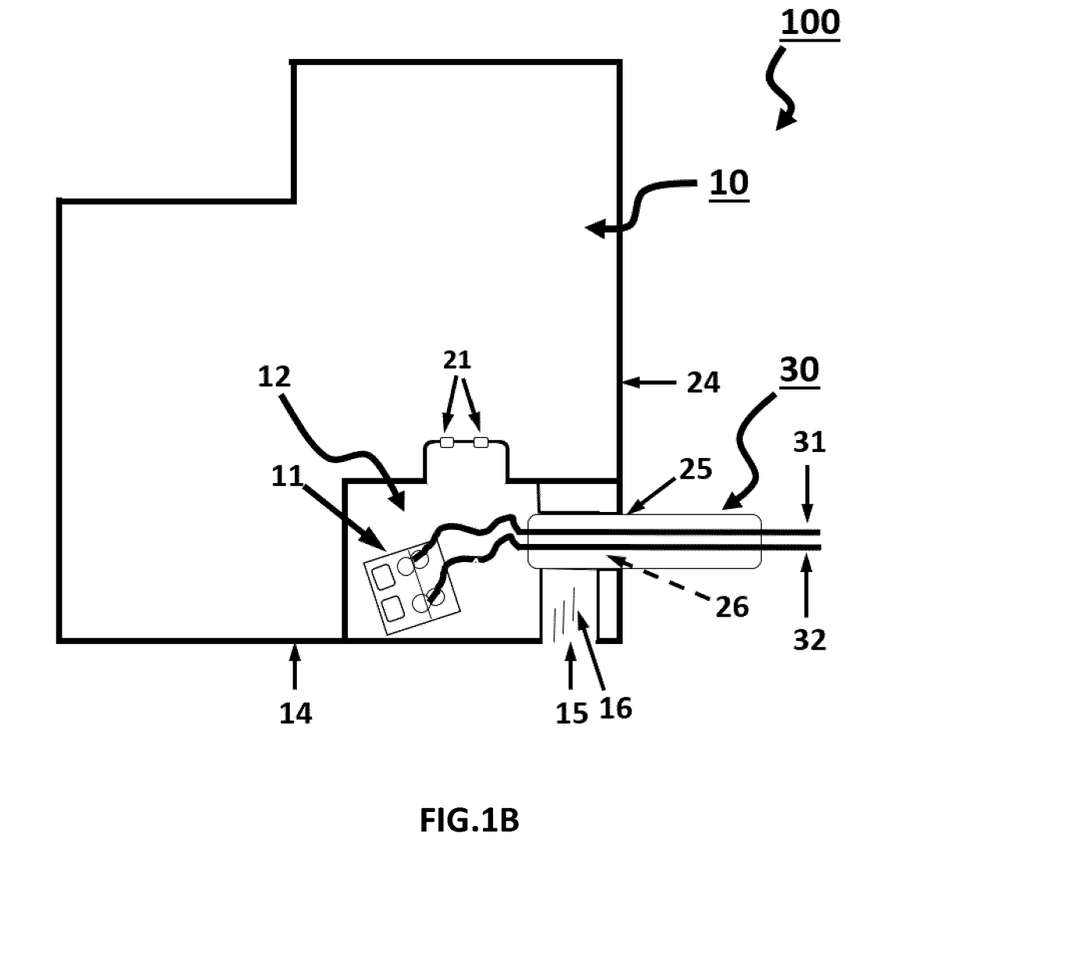
FIG. 1B depicts schematically a top-view thereof.

FIG. 1A depicts schematically, by non-limiting example, an embodiment of a driver housing assembly 100 comprising a driver housing 10 and a mains cable 30. FIG. 1B depicts schematically a top-view of said embodiment depicted in FIG. 1A, but wherein the lid is omitted in the depiction for convenience. The mains cable 30 has a first wire 31 and a second wire 32. Alternatively, said mains cable may be another type of cable. For example: a control cable for e.g. DALI wiring, or a control cable (exiting the driver housing) for driving a load such as e.g. a light source. Said mains cable may furthermore be a mains cable.

The driver housing 10 comprises a terminal block 11. The terminal block 11 connects the first wire 31 and the second wire 32 of the mains cable 30 to a driver (not shown) in the driver housing 10. The first wire 31 and the second wire 32 of the mains cable 30 are therefore clamped by familiar means in the terminal block 11. Alternatively, in some cases, depending on regulations, any wiring of the mains cable may be directly connected to the driver by e.g. soldering.

The driver housing 10 further comprises a first housing wall 14 adjacent and transverse to a second housing wall 24. As the driver housing 10 is essentially a rectangular box, wherein the first housing wall 14 is perpendicular to the second housing wall 24. Alternatively, other configurations may be envisioned for shaping the driver housing, having walls adjacent to each other at other angles. The driver housing may comprise curved edges. The driver housing may comprise a chamfer at an edge. Furthermore, the first housing wall 14 comprises a first entrance 15 arranged for receiving the cable 30. The second housing wall 24 comprises a second entrance 25 arranged for receiving the cable 30.

The driver housing 10 further comprises a compartment 12. The first housing wall 14 and the second housing wall 24 enclose a part of the compartment 12. Consequently, the first entrance 15 and the second entrance 25 open (or lead, or connect, or abut, or are in fluidic connection) to the compartment 12. Moreover, the total volume of the compartment 12 is at most 10% of the total volume of the driver housing 10. Alternatively, the volume share of the compartment compared to the total volume of the driver housing may be respectively 2:10, 3:10, or 1:20. This ensures that the compartment 12 is sufficiently small so that relatively more volume is available for other components in the driver housing 10 such as the driver components and/or sensors. Furthermore, here, the compartment 12 comprises the terminal block 11. In alternative embodiments (not depicted), the terminal block may be in another adjacent compartment.

Referring to FIG. 1A and FIG. 1B, the compartment 12 receives the main cable 30. Namely, the mains cable 30 is received by the second entrance 25. Thus, the first entrance 15 does not receive said mains cable 30 in this situation, but may receive said mains cable 30 whenever the mains cable 30 is re-routed to the first entrance 15. The first entrance 15 and the second entrance 25 both have a partly elliptic shape for receiving the mains cable 30. More specifically, the full elliptic shape is completed when a lid 13 closes the compartment 12 and confines the first entrance 15 and second entrance 25. Said partly elliptic shape is arranged such that the (circular cross-sectional) mains cable 30 can be tight-fitted to the second entrance 25, or (depending on the routing choice) the first entrance 15. Here, the mains cable 30 is tight-fitted to the second entrance 25. Hence, as a result, the mains cable 30 is detachably fixated to the driver housing 10 by means of the second entrance 25, and particularly by an partly elliptic aperture shape of said second entrance 25. Said partly elliptic shape may alternatively be another shape suitable for tight-fitting or snap-fitting a cable, especially a cable with a round cross section.

Thus, alternatively, said elliptic shape may be another shape, e.g. drop shape, for detachably fixating a cable to the driver housing. Said first entrance and/or second entrance may also comprise mechanical means for detachably fixating a cable, such as nudges, protrusions, or snap-fitting mechanisms. Yet alternatively, said compartment may be arranged to output a cable, e.g. to a load to be driven by the driver.

Moreover, still referring to FIG. 1A and FIG. 1B, the compartment 12 comprises a first groove 16 and a second groove 26. Both the first groove 16 and the second groove 26 are arranged for receiving and/or detachably fixating the mains cable 30. Here, since the mains cable 30 is received and detachably fixated by the second entrance 25, the mains cable 30 is further detachably fixated by the second groove 26 (and hence n the present situation not the first groove 16); which second groove 26 provides additional pull-prevention to the mains cable 30. Said detachably fixating of the second groove 26 is enabled, because the second groove 26 is aligned along the centerline of the second entrance 25 and continues the corresponding aperture shape of the second entrance 25 into the compartment. This is mutatis mutandis applicable to the first entrance 15. Said first groove 16 and said second groove 26 may alternatively comprise guiding vanes or protrusions; or may comprise a surface texture, which e.g. may be arranged for stabilizing a cable by e.g. friction or a value of roughness. Said surface texture may serve as an additional pull-prevention. Said surface texture may comprise edges or protruding elements perpendicular to the length axis of a cable detachably fixated within the corresponding groove.

Still referring to FIG. 1A and FIG. 1B, the driver housing 10 comprises a lid 13. The lid 13 itself is not depicted in the top-view of the FIG. 1B for convenience. The lid 13 pivots around points 21 on the driver housing 10. In closed position, the lid 13 closes the compartment 12. Furthermore, in closed position the lid 13 is adjacent to both the first housing wall 14 and the second housing wall 24. The lid 13 comprises a first edge 17 and a second edge 27 which correspond respectively to the first entrance 15 and the second entrance 25. More specifically, said first edge 17 and said second edge 27, in closed position of the lid 13, confine the mains cable 30 in the first entrance 15 and the second entrance 25. In some examples this may provide some play or tolerance for the mains cable, but in the present embodiment the lid 13 in closed position fixates the mains cable 30 in the second entrance 25 (and mutatis mutandis in the first entrance 15 whenever the mains cable 30 is re-routed via the first entrance 15), because the second edge 27 (and mutatis mutandis the first edge 17) complete the partly elliptic shape into a full elliptic shape, thereby providing an elliptic aperture which serves as a tight-fit for the mains cable 30 entering the driver housing 10.

Alternatively, said first edge and said second edge may in closed position of the lid, depending on the design of the lid, confine a cable in respectively the first groove and the second groove; thus extending the function the lid performs at the entrances to the grooves.

Even further, said lid 13 comprises a locking mechanism 18, 19 for locking the lid 13 to the driver housing 10. This locking mechanism comprises a hooked protrusion 18 and a corresponding snap-fit area 19. Thus, a snap-fit locking mechanism is established. Alternatively, said lid may be locked in closed position by a magnetic lock, an adhesive lock such as a sticker, or a tight fit lock; or the lid may alternatively be a separate detachable part.

Even further, as mentioned, the driver housing 10 is essentially a rectangular box. The driver housing 10 comprises a top housing wall 28 opposite and parallel to a bottom housing wall 29, wherein the top housing wall 28 and the bottom housing wall 29 are both adjacent to both the first housing wall 14 and the second housing wall 24. The driver housing 10 comprises a height 21, which height 21 is defined as the shortest distance ranging from the bottom housing wall 29 to the top housing wall 28. In the present embodiment, the compartment 12 is located in the driver housing 10 above a plane 23 spanned by the first housing wall 14 and the second housing wall 24 and parallel to the bottom housing wall 29, wherein the plane is located at 75% of said height 21 of the driver housing 10, hence being in the upper 25% range 22 of said height 21 of the driver housing 10. This enables the driver housing 10 not to be occupied with the compartment 12 at the bottom sections of the driver housing 10, i.e. the bottom 75% of the height 21 of the driver housing 10; which hence allows for a PCB to be placed e.g. along the full surface area corresponding to the bottom housing wall. Alternatively, said plane may be located at 80% or 85% of the height of the driver housing.

All in all, referring to the embodiment depicted in FIG. 1A and FIG. 1B, the driver housing 10 comprises a compartment 12 which receives a mains cable 30; hence providing a driver housing assembly 100. The mains cable 30 is connected to a driver (not depicted) in the driver housing 10 via the terminal block 11. The driver housing 10 further comprises a lid 13 for closing the compartment 12. When the lid 13 is in open position (as depicted), the compartment 12 receives the mains cable 30 via the second entrance 25. However, said mains cable 30 is detachably fixated to the second entrance 25. Thus, the mains cable 30 can be re-routed (whenever necessary) to said first entrance. This enables the mains cable 30 to be received by the driver housing 10 in two different transverse directions. This provides flexibility in configuring the driver housing 10 and assembling it in a product. When the lid 13 is in closed position, the mains cable 30 is therefore confined in either the first entrance or the second entrance.

Thus, the present invention provides an improved driver housing, which advantageously enables a cable to be re-routed within the driver housing, without the need to disconnect said cable from the driver and/or terminal block.

Figure 2:
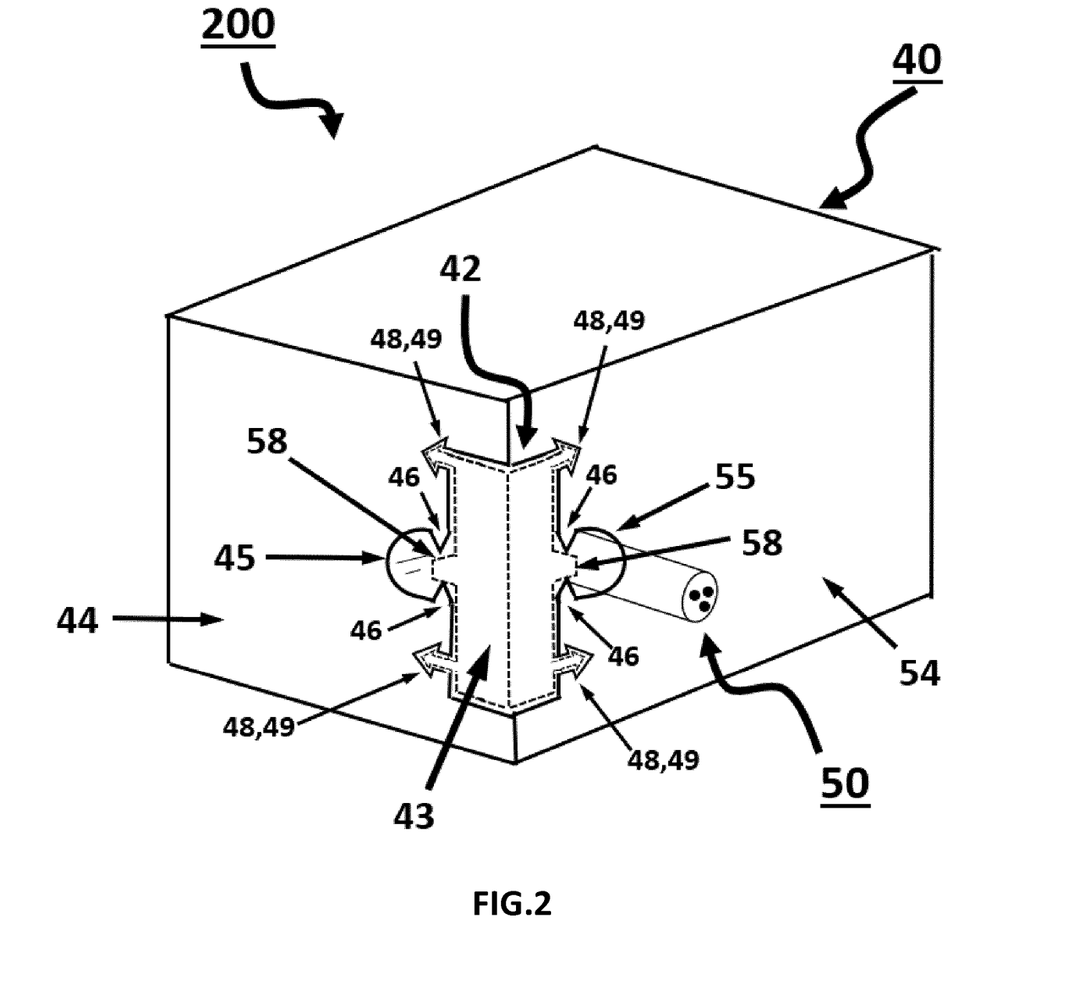
FIG. 2 depicts schematically a second embodiment of a driver housing assembly comprising a driver housing and a control cable.

FIG. 2 depicts schematically, by non-limiting example, an embodiment of a driver housing assembly 200 comprising a driver housing 40 and a control cable 50, which is partly similar to the embodiment depicted in FIG. 1A and FIG. 1B; but with a difference in the lid and compartment.

Said driver housing 40 comprises a terminal block (not depicted) for connecting the control cable 50 driver electronics. Alternatively, said control cable may be directly connected to the driver electronics, e.g. by soldering. The driver housing 40 further comprises a compartment 42 for receiving said control cable 50. Alternatively, said control cable 50 may be outputted by the driver housing 40. The driver housing 40 further comprises a first housing wall 44 adjacent and transverse to a second housing wall 54, wherein both housing walls 44, 54 enclose a part of the compartment 42, and wherein the first housing wall 44 comprises a first entrance 45 and the second housing wall 54 comprises a second entrance 55. The control cable 50 is located at the second entrance 55. The first entrance 45 and the second entrance 55 both comprise a U-shaped aperture. The control cable 50 fits into the circular section of the U-shaped aperture. Said control cable 50 is detachably fixated to said second entrance 55 by means of a snap-fit connection 46. More specifically, said housing walls 44, 54 both comprise teeth 46 pointing inwards to said entrances 45, 55. Said teeth 46 are flexible so as to press a cable trough them and secure and/or confine said cable in the entrances 45, 55. Here, the control cable 50 is snap-fitted to the second entrance 55, which may alternatively be the first entrance 45. However, the control cable still comprises tolerance to move within the second entrance 55.

The driver housing 40 further comprises a lid 43 which closes the compartment 42. The lid is detachable and separable from the driver housing 40. Namely, the lid 43 is detachably fixated to the driver housing 40 by means of protrusions 48 fitting into corresponding slots 49 for securing the lid 43 to the driver housing 40. The lid 43 further in closed position confines the control cable 50 in the second entrance 55. Moreover, in closed position, the lid 43 fixates the control cable 50 in the second entrance 55. Said fixating the control cable 50 in the second entrance 55 is enabled by protruding edges 58 of the lid 43, which protruding edges 58 are, in closed position of the lid 43, protruding inwards in the entrances 45,55 so as to fixate a cable (here the control cable 50) by pressing said cable to the edges of the entrances 45,55 (here i.e. the U-shape of the U-shaped aperture). Thus, the control cable will be tightly secured to the driver housing 40 and pull-prevented due to the friction and the pressing of the protruding edges 58 of the lid 43. Alternatively, when the cable is routed through the first entrance, the same applies mutatis mutandis for the first entrance.

All in all, referring to the embodiment depicted in FIG. 2, the driver housing 40 comprises a compartment 42 which receives a control cable 50; hence providing a driver housing assembly 200. The control cable 50 is connected to a driver (not depicted) in the driver housing 40. The driver housing 40 further comprises a lid 43 for closing the compartment 42. When the lid 43 is in open position (not explicitly depicted), the compartment 42 receives the control cable 50 via the second entrance 55. However, said control cable 50 is detachably fixated to the second entrance 55 by means of the snap-fit connection 46 (i.e. teeth 46). Thus, the control cable 50 can be re-routed (whenever necessary) to said first entrance 45 without detaching the control cable 50 from the terminal block (not depicted) and performing unnecessary multiple wiring actions. This enables the control cable 50 to be received by the driver housing 40 in two different transverse directions, or alternatively phrased at the first housing wall 44 or the second housing wall 54. This provides flexibility in configuring the driver housing 40 and assembling it in a product. When the lid 43 is in closed position (as depicted), the control cable 50 is therefore confined in either the first entrance or the second entrance. Even further, in closed position (as depicted), the lid 43 confines and fixates the control cable 50 to the driver housing 40 by means of tightly pressing the control cable 50 to the second entrance 55 with the corresponding protruding edge 58 of the lid 43.

Thus, the present invention provides an improved driver housing, which advantageously enables a cable to be re-routed within the driver housing, without the need to disconnect said cable from the driver and/or terminal block.

Figure 3:
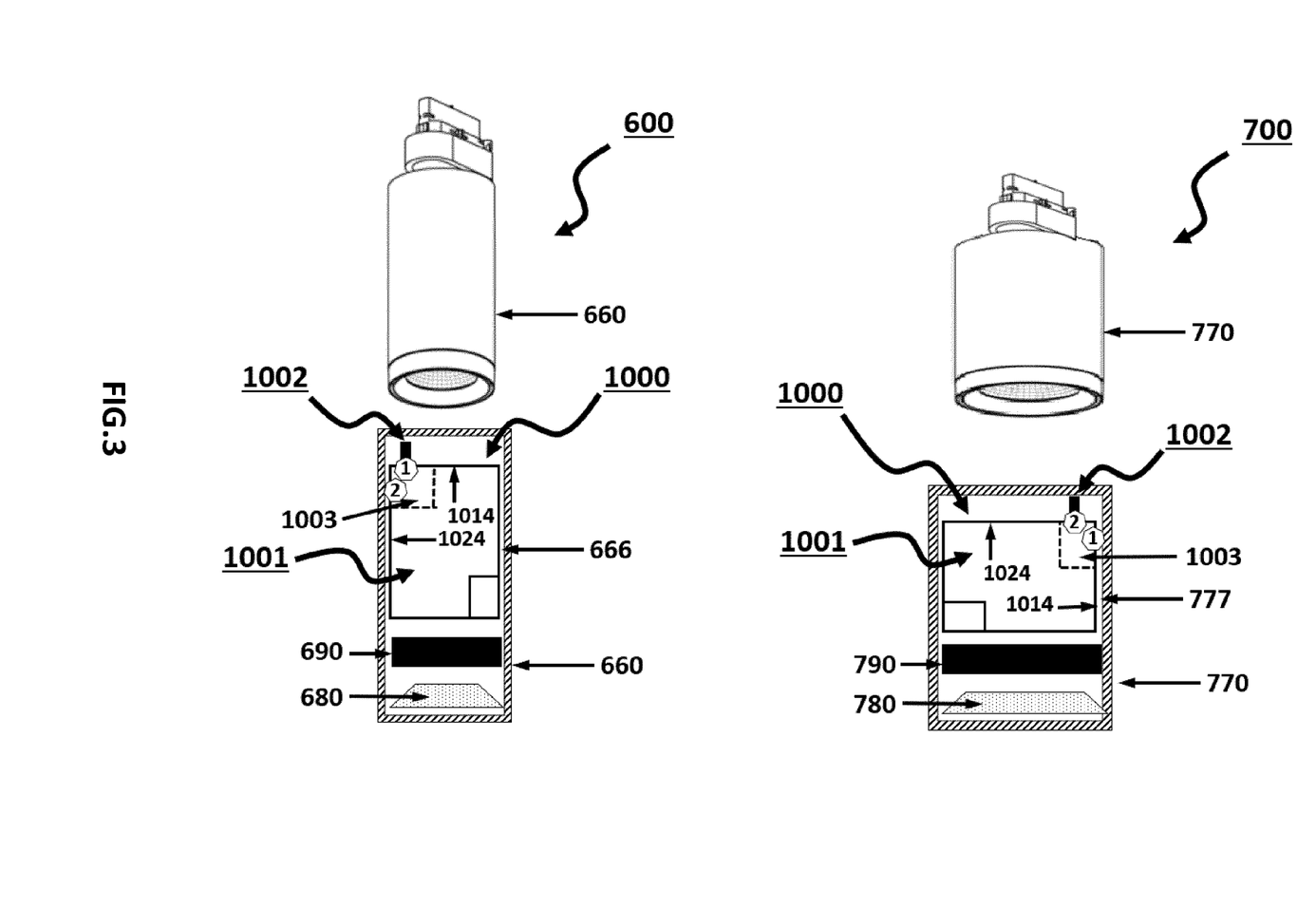
FIG. 3 depicts schematically, by non-limiting example, an embodiment of a small-diameter spot light an embodiment of a large-diameter spot light.

FIG. 3 depicts schematically, by non-limiting example, an embodiment of a small-diameter spot light 600. FIG. 3 also depicts schematically, by non-limiting example, an embodiment of a large-diameter spot light 700. Both figures comprise a cut-through side-view as well. The small-diameter spot light 600 has a smaller diameter with respect to the large-diameter spot light 700. Moreover, the small-diameter spot light 600 has a bigger height compared to the large-diameter spot light 700. The small-diameter spot light 600 and the large-diameter spot light 700 may for example be, respectively, the 20-Watt model and the 36-Watt model of the Philips LED Spotlight track lighting. Both spot lights 600, 700 are made of metal. Alternatively, said spot lights may be made of a plastic or a ceramic, or made of an assembly of said mentioned materials.

The small-diameter spot-light 600 and the large-diameter spot-light 700 both comprise a cylindrical housing 660, 770. Said cylindrical housing is essentially a hollow tube. Said cylindrical housing 660, 770 comprises an inner wall 666, 777. The inner wall 666, 777 is the wall extending in the axial direction of the cylindrical housing 660, 770. Alternatively, said cylindrical housing may be any other tubular housing such as a square housing. Furthermore, within the cylindrical housing 660, 770, the spot-lights 600, 700 comprise a LED light source 680,780 and a heat sink 690,790. The area above the heat sink is free for e.g. accommodating driver electronics.

The small-diameter spot light 600 and the large-diameter spot light 700 both accommodate a driver housing assembly 1000 according to the present invention, e.g. the driver housing assembly 100, 200 as depicted in the embodiments of FIG. 1A-B and FIG. 2. This driver housing assembly 1000 is an assembly of a driver housing 1001 with a driver (not depicted) and a mains cable 1002 feeding the driver (not depicted). Similarly as mentioned in examples before: The driver housing 1001 is essentially a rectangular box with a first housing wall 1014 adjacent and transverse to a second housing wall 1024, wherein the first housing wall 1014 comprises a first entrance 1 arranged for receiving the mains cable 1002 and the second housing wall 1024 comprises a second entrance 2 arranged for receiving the mains cable 1002, and wherein said first housing wall 1014 and said second housing wall 1024 enclose a part of a compartment 1003 for receiving the mains cable 1002. The driver housing 1001 further comprises a lid (not depicted) for closing the compartment 1003 and for in closed position confining the mains cable 1002 in the first entrance 1 and the second entrance 2.

Still referring to FIG. 3, the driver housing assembly 1000 is fitted to the cylindrical housing 660, 770 of both the small-diameter spot light 600 and the large-diameter spot light 700. Hereby, being different for both spot lights 600, 700: either the first housing wall 1014 or the second housing wall 1024 is in connection with said inner wall 666, 777 of respectively the large-diameter spot light 700 and the small-diameter spot light 600. Namely, the driver housing assembly 1000 is slid into said cylindrical housing 660, 770. This is possible, because the location on the driver housing 1001 where the mains cable 1002 enters/exits the driver housing 1001 is not a fixed constraint anymore. Thus, the driver housing assembly 1000 can be efficiently (and tightly) positioned in the cylindrical housing 660, 760.

It is noted that the same driver housing assembly 1000 can be fitted into the two different spot lights 600, 700 and their respective measures and configurations; without the need to disconnect said mains cable 1002 from the driver. This provides efficiency and ergonomics in installing a driver into a housing and a luminaire. The present invention enables to re-route the mains cable 1002 efficiently and ergonomically from the first entrance 1 to the second entrance 2, thereby enabling the same driver housing assembly 1000 to be fitted from the small-diameter spot light 600 to the large-diameter spot light 700.

For example: Note that as the first entrance 1 has no tolerance with respect to the inner wall 777 of the cylindrical housing 770 of the large-diameter spot light 700, the driver housing assembly cannot be fitted into the large-diameter spot light 700, because the driver housing assembly 1000 will then stick out the end and not fit the large-diameter spot light 700, which has a shorter length. Thus, whenever the mains cable 1002 is statically fixated to the first entrance, the driver housing assembly 1002 may not be able to be fitted in different types of spot lights, hence prohibiting to miniaturize (e.g. the height of the spot lights).

Hence, as mentioned before, the driver housing 1001 enables the mains cable 1002 to be re-routed within the driver housing 1001, without the need to disconnect said mains cable 1002 from the driver, or driver housing 1001. Hence, the driver housing 1001 provides flexibility and ergonomics in positioning the mains cable 1002 accordingly without the need of a wiring operation (i.e. disconnecting/connecting the wiring of the driver). Thus, re-routing of the mains cable 1002 is possible without disassembling the driver housing 1001 or performing disconnecting activities for wiring. In other words, the improved driver housing according to the present invention provides flexibility to re-route the cable and choose the location where the cable enters/exits the driver housing, without the need to disconnect the cable from the driver.

Figure 4:
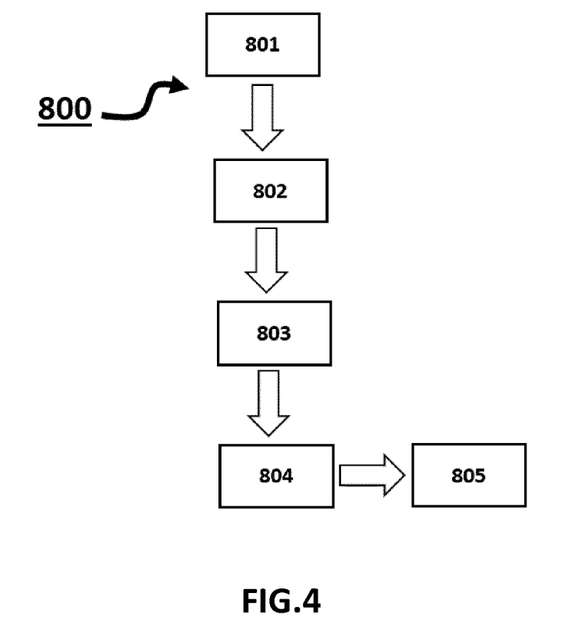
FIG. 4 depicts schematically, within a flowchart, an embodiment of a method of confining a cable in a driver housing.

FIG. 4 depicts schematically, within a flowchart, an embodiment of a method 800 of confining a cable in a driver housing according to the invention. Here, e.g. the driver housing assembly 100 of the embodiment depicted in FIG. 1A and FIG. 1B is used to implement the steps of the method 800. In a first step 801, the mains cable 30 is connected to the terminal block 11. In a second step 802, the mains cable 30 is received and detachably fixated via the second entrance 25; as partly explained before. Subsequently, in a third step 803, the mains cable 30 is confined in the second entrance 25 by closing the lid 13.

Moreover, the method may be continued by re-routing the mains cable 30 to the first entrance 15. Said re-routing continues the method with a step 804 opening the lid 13, and step 805 in which the mains cable 30 is detached from the second entrance 25 and detachably fixated in the first entrance 15, as partly explained before. Subsequently, the method comprises step 806 of closing the lid so as to confine the mains cable 30 to the first opening 15.

These method steps may mutatis mutandis apply to the embodiment depicted in FIG. 2, wherein the control cable may be fixated to the second entrance and hence driver housing upon closing the lid.

Figure 5:
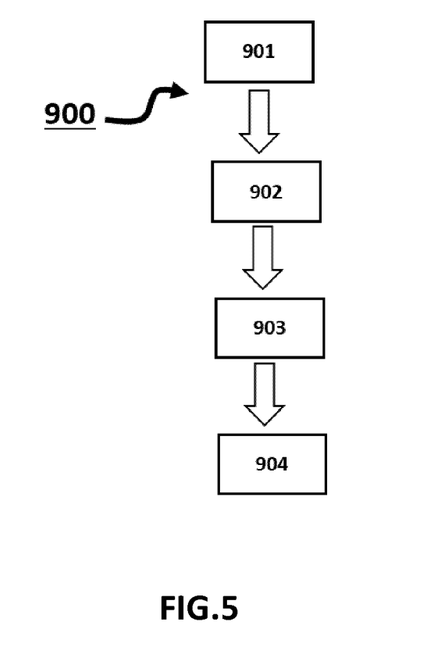
FIG. 5 depicts schematically, within a flowchart, an embodiment of a method of accommodating a driver housing assembly in a luminaire comprising a luminaire housing.

FIG. 5 depicts schematically, within a flowchart, an embodiment of a method 900 of accommodating a driver housing assembly 1000 in a luminaire 700 comprising a luminaire housing 770. Here, the driver housing assembly 1000 of the embodiment depicted in FIG. 3 is used to implement the steps of the method 900. Said method 900 comprises the step 901 of:

fitting the driver housing assembly 1000 inside the cylindrical housing 770 of the large-diameter spot light 700, wherein the driver housing assembly 1000 is in connection the inner wall 777 via the first housing wall 1014, and wherein the mains cable 1002 is received and detachably fixated by the driver housing 1000 via the second entrance 2.

Moreover, the method 900 may be continued by the step 902 of taking out the driver housing assembly 1000 and step 903 of re-routing the mains cable 1002 to the first entrance 1, without the need to disconnect the mains cable from the driver, and step 904 of fitting the driver housing assembly 1000 now inside the cylindrical housing 660 of the small-diameter spot light 700, wherein the driver housing assembly 1000 is in connection the inner wall 666 via the second housing wall 1024, and wherein the mains cable 1002 is received and fixated by the driver housing 1000 via the first entrance 1. Alternatively, said method step 904 of fitting the driver housing assembly back into a cylindrical housing of a spot light may be fitting the driver housing assembly back into the same luminaire housing, but now in another configuration. For example, positioning the driver housing assembly in a tight fit along its opposite or adjacent edge/wall.

Hence, the improved driver housing according to the present invention provides flexibility to re-route the cable and choose the location where the cable enters/exits the driver housing, without the need to disconnect the cable from the driver.

Figure 6:
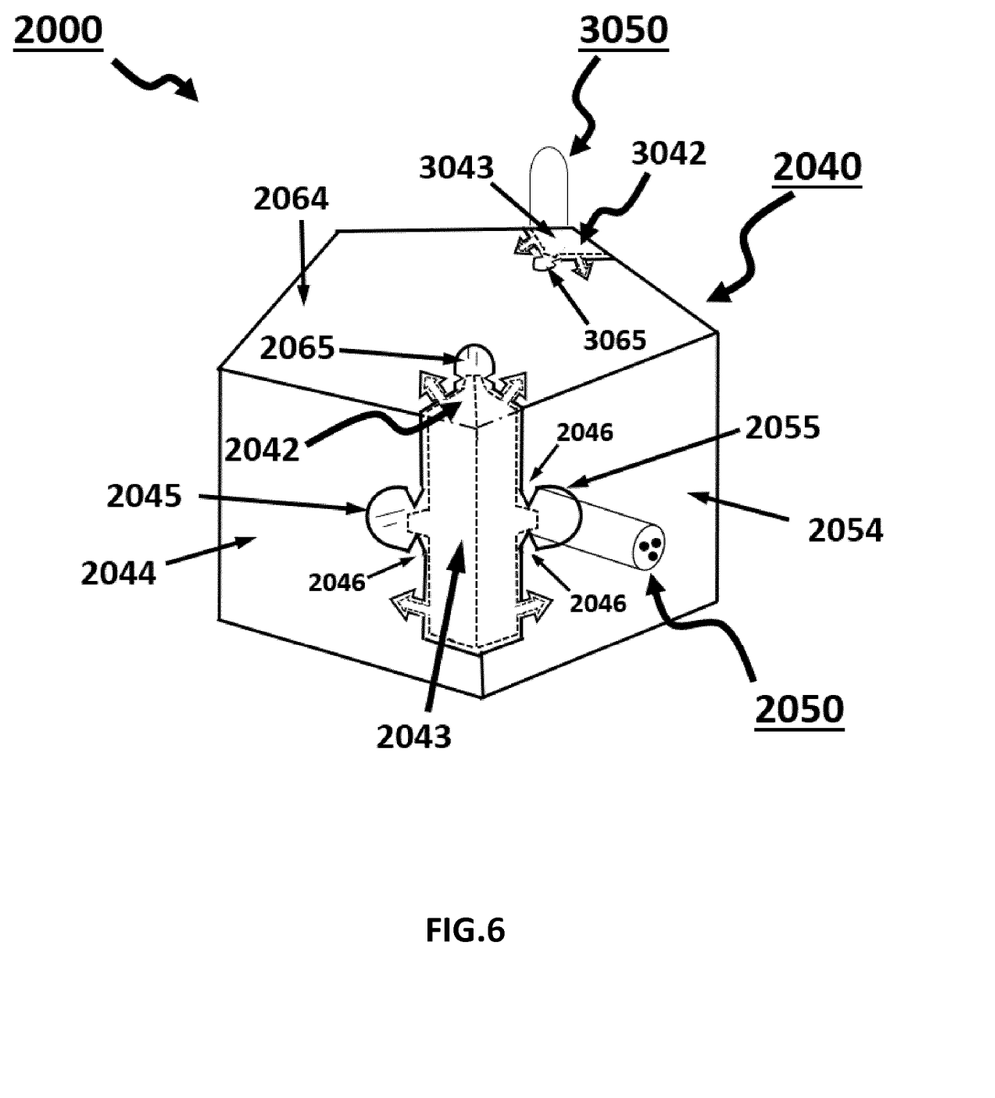
FIG. 6 depicts schematically a third embodiment of a driver housing assembly comprising a driver housing and a control cable, wherein the driver housing comprises a second compartment.

FIG. 6 depicts schematically, by non-limiting example, an embodiment of a driver housing assembly 2000 comprising a driver housing 2040, a control cable 2050 and a further cable 3050, which is partly similar to the embodiment depicted in FIG. 2; but differs in that the driver housing 2040 is a pentagon box further comprising comprises a third entrance 2065 for re-routing the control cable 2050. Moreover, the embodiment depicted in FIG. 6 comprises a further compartment 3042 for receiving said further cable 3050, as similarly done at the (initial/first) compartment 2042.

Thus, referring to FIG. 6, the driver housing 2040 comprises the shape of a pentagon box. Therefore, the driver housing 2040 comprises a first housing wall 2044 adjacent and under an inner angle of one-hundred-and-eight degrees to a second housing wall 2054. The driver housing further comprises a third housing wall 2064 adjacent to the first housing wall 2044 and to the second housing wall 2054. All three housing walls 2044, 2054, 2064 enclose a part of the compartment 2042. The compartment 2042 is arranged for receiving the control cable 2050. The first housing wall 2044 comprises a first entrance 2045, the second housing wall 2054 comprises a second entrance 2055, and the third housing wall 2064 comprises a third entrance 2065.

The control cable 2050 is connected to a driver (not depicted) in the driver housing 2040. The driver housing 2040 further comprises a lid 2043 for closing the compartment 2042. The lid 2043 is detachable and separable from the driver housing 2040. The lid 2043 is partly similar to the embodiment depicted in FIG. 2, but now extends to the third housing wall 2064 and serves as a lid 2043 for the third entrance 2065. When the lid 2043 is in open position (not explicitly depicted), the compartment 2042 receives the control cable 2050 as depicted here via the second entrance 2055. However, the control cable 2050 may also be re-routed and received by either the first entrance 2045 or the second entrance 2065. Here, said control cable 2050 is detachably fixated—similarly as the embodiment depicted in FIG. 2—to the second entrance 2055 by means of the snap-fit connection 2046 (i.e. teeth 2046). The first entrance 2045, the second entrance 2055, and the third entrance 2065 are hereby similarly configured.

Thus, the control cable 2050 can be re-routed (whenever necessary) to either said first entrance 2045 or said third entrance 2065 without detaching the control cable 2050 from (a terminal block in) the driver housing 2040. This enables the control cable 2050 to be received by the driver housing 2040 in three different directions without detaching the control cable 2050. This provides flexibility in configuring the driver housing 2040 and assembling it in a product.

Still referring to FIG. 6, as mentioned, the driver housing 2040 comprises a further compartment 3042 for receiving the further cable 3050. The further compartment 3042 also comprises a lid 3043. Said further compartment 3042 and its corresponding lid 3043 are configured similarly (mutatis mutandis) as the compartment 2042 and its corresponding lid 2043; but now at another edge of the pentagon shape of the driver housing 2040, i.e. an opposite edge. Therefore, the further compartment 3042 is able to receive the further cable 3050 via a fourth (not depicted), a fifth (not depicted) and a sixth entrance 3065. The further cable 3050 is received via the fifth entrance. As a result, the driver housing 2040 comprises two compartments for receiving two different cable, which are on opposite edges, such that more flexibility is arranged in re-routing said cables. The first compartment may for example host an entering cable, while the further compartment may for example host an existing cable. For example, respectively, a mains cable and a load driving cable.

Thus, the present invention provides an improved driver housing, which advantageously enables a cable to be re-routed within the driver housing at multiple locations where a cable is to enter/exit the driver housing, without the need to disconnect said cable from the driver and/or terminal block.

Referring to all embodiments, the driver housing may alternatively comprise a chamfered edge (not depicted). Such a chamfered edge may be applied to the edges where one driver housing wall is adjacent to another driver housing wall. Such a chamfered edge may facilitate fitting such a driver housing and the corresponding driver housing assembly into a luminaire, or a luminaire housing. Alternatively, fitting said driver housing assembly into an electronic device housing.

Referring to all embodiments, said driver housing according to the invention may alternatively be extrapolated to other fields of application such as a housing for an electrical device, such as for example a driver, a sensor, a lighting unit or a battery, or a combination of any of these.

The invention claimed is:

1. A luminaire comprising a luminaire housing accommodating a driver housing assembly, the driver housing assembly comprising a driver housing and a cable;
the driver housing comprising:
a terminal block for connecting a cable to a driver;
a compartment for receiving the cable;
a first housing wall adjacent to a second housing wall, wherein the first housing wall comprises a first entrance arranged for receiving the cable and the second housing wall comprises a second entrance arranged for receiving the cable, and wherein said first housing wall and said second housing wall enclose a part of the compartment;

a lid for closing the compartment and for in closed position confining the cable in the first entrance or the second entrance;

wherein the cable is connected to the terminal block, and wherein the cable is received by the driver housing via either the first entrance or the second entrance.

2. The luminaire according to claim 1, wherein the first housing wall is transverse to the second housing wall.

3. The luminaire according to claim 1, wherein the first entrance and the second entrance are arranged for detachably fixating the cable to the driver housing.

4. The luminaire according to claim 1, wherein the compartment comprises a first groove arranged for receiving or detachably fixating the cable, and wherein the compartment comprises a second groove arranged for receiving or detachably fixating the cable.

5. The luminaire according to claim 1, wherein in closed position the lid fixates the cable in the first entrance or in the second entrance.

6. The luminaire according to claim 1, wherein the compartment comprises the terminal block.

7. The luminaire according to claim 1, wherein the first housing wall is perpendicular to the second housing wall with an angular margin of at most 5 degrees.

8. The luminaire according to claim 1, wherein the driver housing further comprises a top housing wall opposite and parallel to a bottom housing wall, wherein the top housing wall and the bottom housing wall are both adjacent to both the first housing wall and the second housing wall;

wherein the driver housing further comprises a height, the height being defined as the shortest distance ranging from the bottom housing wall to the top housing wall; and wherein the compartment is located in the driver housing above a plane spanned by the first housing wall and the second housing wall and parallel to the bottom housing wall, which plane is located within the upper 25% of said height of the driver housing.

9. The luminaire according to claim 1, wherein the cable is a mains cable.

10. The luminaire according to claim 1, wherein the luminaire housing comprises an inner wall for fitting the driver housing assembly, and wherein the driver housing assembly is in connection with said inner wall via either the first housing wall or the second housing wall.

11. The luminaire according to claim 1, wherein the luminaire is a spot light.

12. A driver housing for use in the luminaire according to claim 1.

13. A kit of parts comprising the driver housing according to claim 12.

14. A method of confining a cable in a luminaire according to claim 1, wherein the method comprises the steps of:

connecting the cable to the terminal block;

receiving and/or detachably fixating the cable via either the first entrance or the second entrance;

confining the cable in respectively the first entrance or the second entrance by closing the lid.

15. A method of accommodating a driver housing assembly in a luminaire comprising a luminaire housing, wherein the luminaire housing comprises an inner wall for fitting the driver housing assembly;

wherein the driver housing assembly comprises a driver housing and a cable, the driver housing comprising:

a terminal block for connecting a cable to a driver;

a compartment for receiving the cable;

a first housing wall adjacent to a second housing wall, wherein the first housing wall comprises a first entrance arranged for receiving the cable and the second housing wall comprises a second entrance arranged for receiving the cable, and wherein said first housing wall and said second housing wall enclose a part of the compartment;

a lid for closing the compartment and for in closed position confining the cable in the first entrance or the second entrance;

wherein the cable is connected to the terminal block, and wherein the cable is received and/or detachably fixated by the driver housing via either the first entrance or the second entrance; and the method comprises the steps of:

fitting the driver housing assembly inside the luminaire housing of the luminaire, wherein the driver housing assembly is in connection with said inner wall via either the first housing wall or the second housing wall, and wherein the cable is received or detachably fixated by the driver housing via either the first entrance or the second entrance.

* * * * *